(12) United States Patent
Shoji

(10) Patent No.: US 12,027,404 B2
(45) Date of Patent: Jul. 2, 2024

(54) PROCESSING APPARATUS

(71) Applicant: DISCO CORPORATION, Tokyo (JP)

(72) Inventor: Keiichi Shoji, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 1059 days.

(21) Appl. No.: 16/896,384

(22) Filed: Jun. 9, 2020

(65) Prior Publication Data

US 2020/0391346 A1 Dec. 17, 2020

(30) Foreign Application Priority Data

Jun. 17, 2019 (JP) .................................. 2019-112301

(51) Int. Cl.
*H01L 21/683* (2006.01)
*B24B 41/06* (2012.01)
*B24B 51/00* (2006.01)

(52) U.S. Cl.
CPC ............ *H01L 21/683* (2013.01); *B24B 41/06* (2013.01); *B24B 51/00* (2013.01)

(58) Field of Classification Search
CPC ............. H01L 21/683; H01L 21/67778; H01L 21/67775; H01L 21/67772; H01L 21/67766; H01L 21/67763; H01L 21/67745; H01L 21/67742; B25J 9/1623; B25J 15/0253; B24B 51/00; B24B 41/06
USPC .... 414/622, 416.08, 416.03, 416.02, 416.01, 414/225.01, 222.12, 222.07, 222.02, 414/222.01
See application file for complete search history.

(56) References Cited

U.S. PATENT DOCUMENTS 8,550,765 B2 * 10/2013 Cottone ............... B65G 49/067
414/744.3
2003/0091409 A1 * 5/2003 Danna ............... H01L 21/68707
414/217

(Continued)

FOREIGN PATENT DOCUMENTS

DE 102017202041 A1 8/2017
JP 2014204020 A 10/2014
JP 2017130515 A 7/2017

OTHER PUBLICATIONS

German Machine Translation Search Report for counterpart German Patent Application No. 10 2020 207 132.2 dated Aug. 29, 2023 (7 pages).

*Primary Examiner* — Glenn F Myers
(74) *Attorney, Agent, or Firm* — Greer, Burns & Crain, Ltd.

(57) ABSTRACT

A conveying unit of a processing apparatus includes a clamping section that clamps a workpiece, and a conveying arm that enables the clamping section to be moved in a height direction and in directions of advancing toward and retracting away from a cassette. The clamping section includes a support section that supports a lower surface of the workpiece, a presser section that makes contact with an upper surface of the workpiece and clamps the workpiece between itself and the support section, and a driving unit that relatively moves the support section and the presser section away from and toward each other. The conveying unit further includes a light reflection type sensor that irradiates the workpiece accommodated in the cassette with light, the light reflection type sensor being fixed to the clamping section and being disposed at a same height as a height when the clamping section clamps the workpiece.

5 Claims, 14 Drawing Sheets

(56) References Cited

U.S. PATENT DOCUMENTS

| | | | |
|---|---|---|---|
| 2004/0012363 A1* | 1/2004 | Simondet | B25J 19/025 318/568.21 |
| 2004/0052624 A1* | 3/2004 | Miyano | H01L 21/67265 414/940 |
| 2020/0098604 A1* | 3/2020 | Sugimoto | H01L 21/67265 |
| 2020/0139558 A1* | 5/2020 | Vu | B25J 13/081 |

* cited by examiner

PROCESSING APPARATUS

BACKGROUND OF THE INVENTION

Field of the Invention

The present invention relates to a processing apparatus.

Description of the Related Art

Conventionally, in a processing apparatus for processing a semiconductor wafer, wafers accommodated in a cassette in a state in which the wafer and an annular frame are united together through a dicing tape are conveyed out of the cassette one by one, whereby processing of the wafer is conducted. In such a processing apparatus, as a conveying arm for drawing out the wafer from the cassette, a clamping section that clamps the wafer and a part called push-pull arm enabling the clamping section to be moved in advancing and retracting directions and vertical direction may be used. In the clamping section, presser sections on the upper and lower sides are moved in the vertical direction relative to a support section on the lower side, and the movement of the presser sections is sensed by a sensor, to detect whether or not the wafer has been held.

In addition, as the processing apparatus in which the wafers are conveyed out of the cassette one by one, there is one which is separately provided, at a position facing the cassette, with an optical sensor that detects whether or not the wafer is currently accommodated on each stage in the cassette (see, for example, Japanese Patent Laid-open No. 2014-204020).

SUMMARY OF THE INVENTION

In the processing apparatus in which the moving amount of the presser sections is sensed by a sensor to detect whether or not the wafer has been held, in the case of holding a thin wafer, the spacing between the presser section and the support section may become very narrow, and erroneous detection that the wafer has not been held may occur. In order to solve this problem, a method in which a non-contact arm and a holding section for holding the wafer are enlarged and the wafer is suction held from the lower side may be contemplated, but this approach leads to a rise in cost.

In addition, depending on the wafer, there are cases where it is desirable to draw out the wafer without touching a device region. In the case where the wafer is shallowly accommodated in the cassette, the clamping section may touch the device region.

It is an object of the present invention to provide a processing apparatus with which the presence or absence of a wafer accommodated on each stage in a cassette and whether or not the wafer has been suitably drawn out after being clamped can be determined, and with which the wafer can be held at a suitable position.

In accordance with an aspect of the present invention, there is provided a processing apparatus including a holding table that holds a workpiece, a processing unit that processes the workpiece held by the holding table, a cassette that is disposed on a cassette base and accommodates a plurality of the workpieces, a conveying unit that is disposed such as to be insertable into the cassette and conveys the workpiece into and out of the cassette, and a control unit that controls the holding table, the processing unit and the conveying unit, in which the conveying unit includes a clamping section that clamps the workpiece, a conveying arm that enables the clamping section to be moved in a height direction and in directions of advancing toward and retracting away from the cassette, and a light reflection type sensor that irradiates the workpiece accommodated in the cassette with light, the light reflection type sensor being fixed to the clamping section and being disposed at a same height as a height when the clamping section clamps the workpiece, the clamping section includes a support section that supports a lower surface of the workpiece, a presser section that makes contact with an upper surface of the workpiece and clamps the workpiece between itself and the support section, and driving means that relatively moves the support section and the presser section away from and toward each other.

According to this configuration, it is possible to provide a processing apparatus with which the presence or absence of a wafer accommodated on each stage in a cassette and whether or not the wafer has been suitably drawn out after being clamped can be determined, based on the results of detection by one light reflection type sensor, for example, and with which the wafer can be held at a suitable position.

Preferably, the cassette includes a pair of side walls facing each other, a bottom surface connecting the side walls, and a plurality of pairs of shelves which project inward from the pair of facing side walls and on which the workpieces are respectively placed, the light reflection type sensor irradiates the workpieces accommodated respectively on the shelves of the cassette with light while moving vertically attendant on a movement of the clamping section, and the control unit includes a presence/absence determining section that, when reflected light is below a preset threshold, determines that the workpiece is absent on the relevant shelf. According to this configuration, it is possible to provide a processing apparatus with which the presence or absence of the wafer accommodated on each stage in the cassette can be easily determined based on the results of detection by the light reflection type sensor.

Preferably, the control unit includes a clamping light amount recording section that records a reflected light amount at a stage at which the workpiece accommodated in the cassette is clamped by the clamping section, a draw-out light amount recording section that records a reflected light amount at a stage at which the clamping section is spaced away from the cassette in order to draw out the workpiece from the cassette, and a draw-out determining section that, when a difference between the light amounts recorded in the clamping light amount recording section and the draw-out light amount recording section exceeds a threshold, determines that the workpiece has not been drawn out suitably. According to this configuration, it is possible to provide a processing apparatus with which whether or not the wafer has been suitably drawn out after being clamped can be easily determined based on the results of detection by the light reflection type sensor.

Preferably, the control unit includes an allowable range recording section that records correlation between a length of insertion of the workpiece into the clamping section in a state in which the support section and the presser section are spaced away from each other and the reflected light amount according to the respective length, and records an allowable range of the reflected light amount corresponding to the length as an allowable range, and an advance/retraction control section that, when conveying the workpiece into or out of the cassette, advances or retracts the clamping section such that the range of the reflected light amount is within the allowable range. According to this configuration, it is possible to provide a processing apparatus with which the wafer can be held at a suitable position (for example, at only outer edges) based on the results of detection by the light reflection type sensor.

According to the present invention, an effect that the presence or absence of the wafer accommodated on each stage in the cassette and whether or not the wafer has been suitably drawn out after being clamped can be determined and an effect that only outer edges of the wafer can be clamped are produced.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENTS

Figure 1:
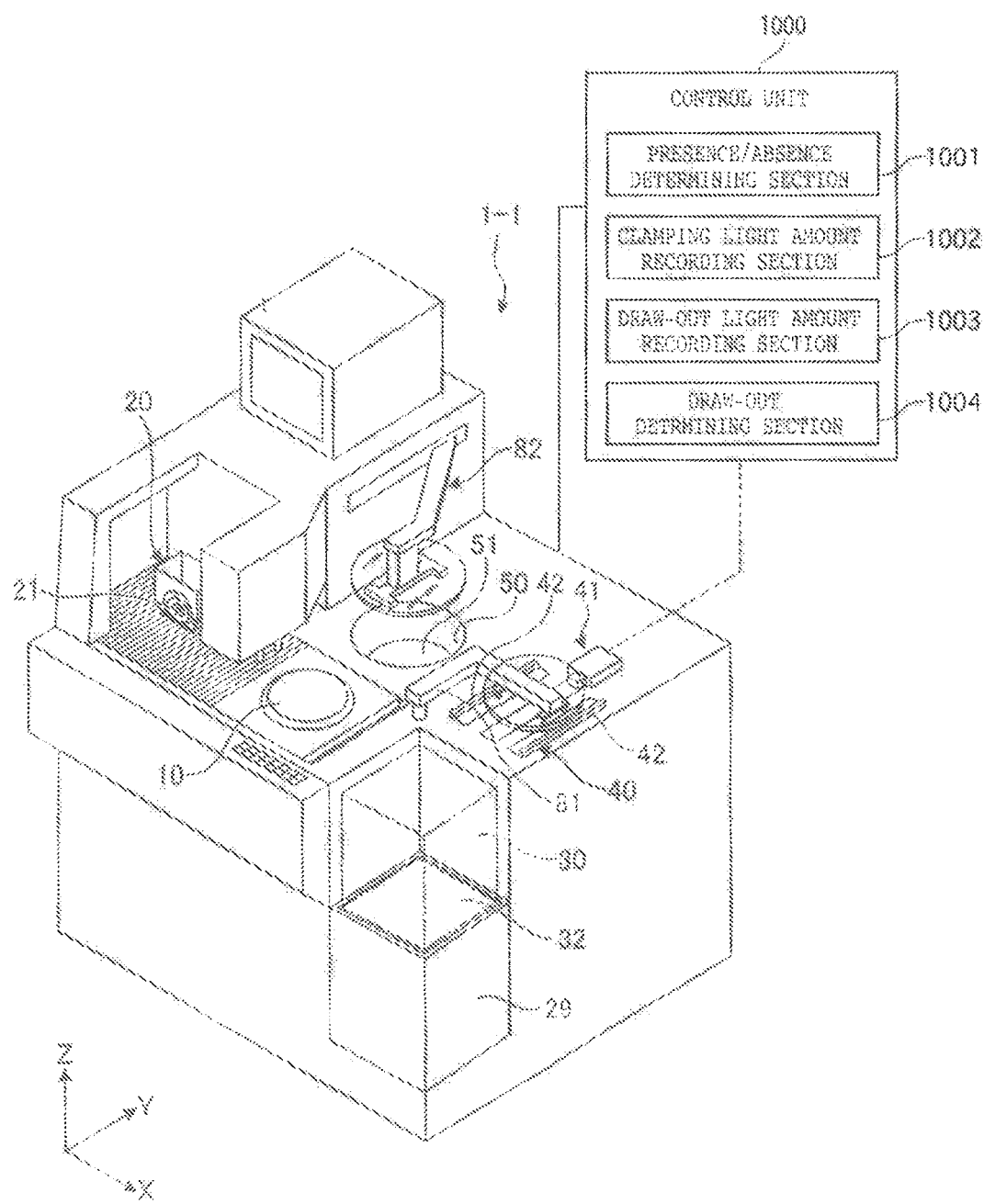
FIG. 1 is a perspective view depicting an outline of a configuration example of a cutting apparatus according to a first embodiment.

Embodiments of the present invention will be described in detail below, referring to the drawings. The present invention is not to be limited by the contents of the following description of the embodiments. In addition, the components described below include those which are easily conceivable by those skilled in the art and substantial equivalents thereof. Further, the configurations described below can be combined as required. Besides, various omissions, substitutions or modifications of the configurations are possible within such ranges as not to depart from the gist of the present invention.

In the embodiments described below, an XYZ rectangular coordinate system is set, and the positional relations of the components will be described referring to the XYZ rectangular coordinate system. On direction in a horizontal plane is set as an X axis direction, a direction orthogonal to the X axis direction in the horizontal plane is set as a Y axis direction, and a direction orthogonal to the X axis direction and the Y axis direction is set as a Z axis direction. An XY plane containing the X axis and the Y axis is parallel to the horizontal plane. The Z axis direction orthogonal to the XY plane is the vertical direction.

First Embodiment

Figure 2:
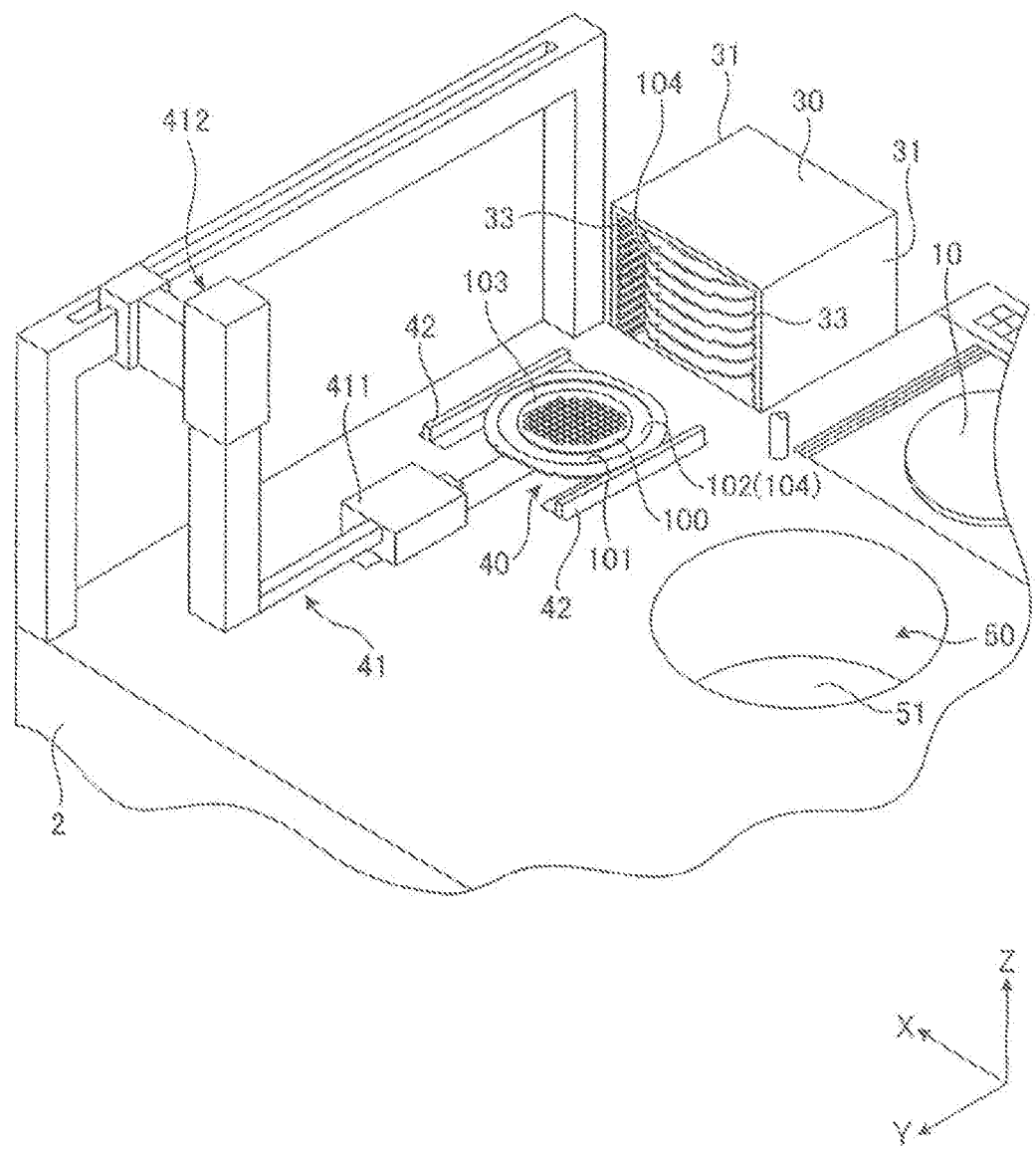
FIG. 2 is a perspective view depicting an outline of an essential part of a configuration example of the cutting apparatus according to the first embodiment.
Figure 3:
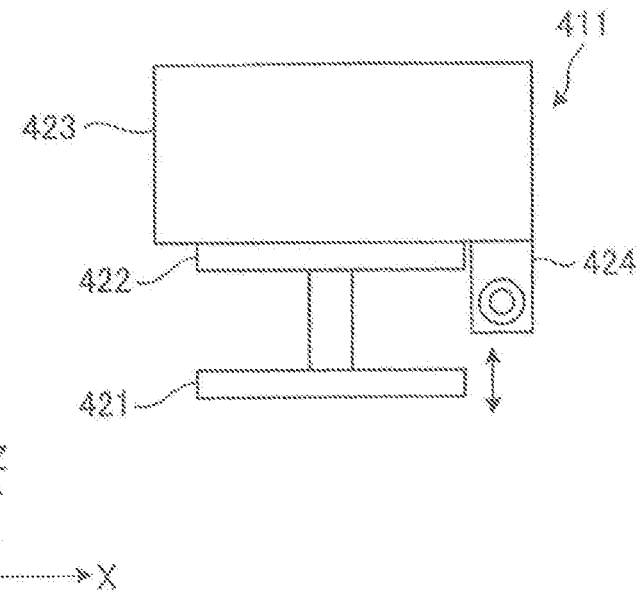
FIG. 3 is a front view of a clamping section according to the first embodiment.
Figure 4:
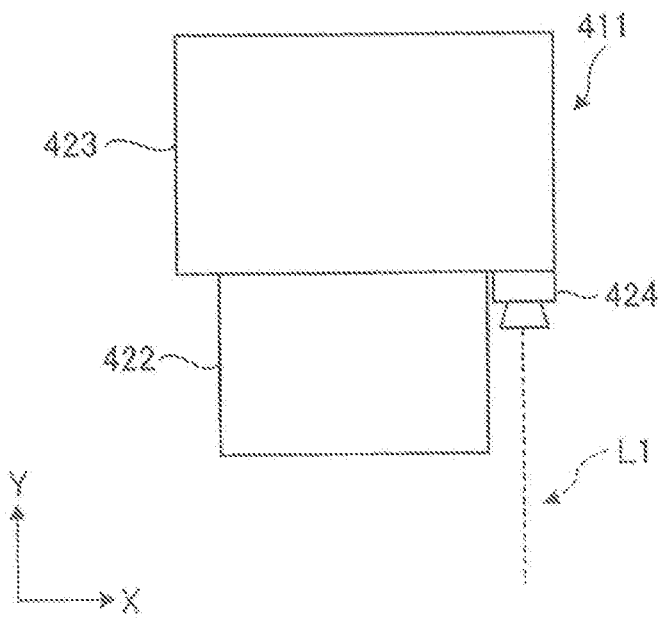
FIG. 4 is a plan view of the clamping section according to the first embodiment.
Figure 5:
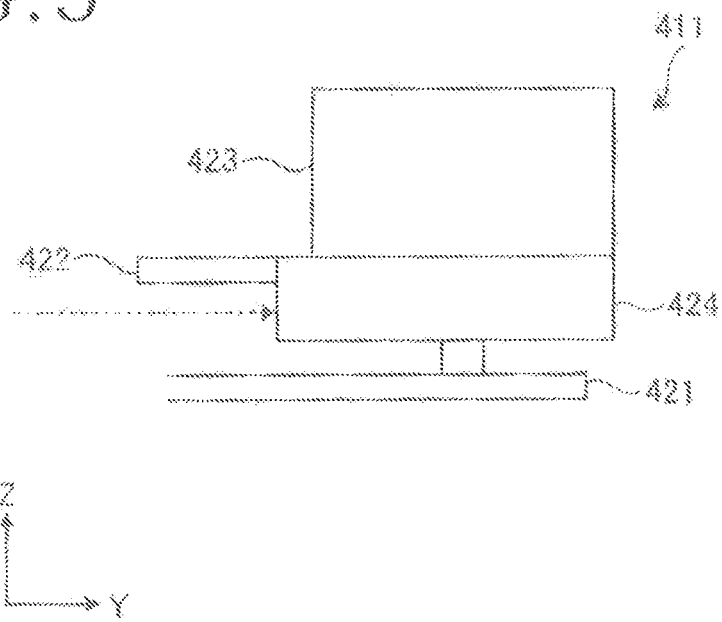
FIG. 5 is a side view of the clamping section according to the first embodiment.

FIG. 1 is a perspective view depicting an outline of a configuration example of a cutting apparatus according to a first embodiment. FIG. 2 is a perspective view depicting an outline of an essential part of the configuration example of the cutting apparatus according to the first embodiment. FIG. 3 is a front view of a clamping section according to the first embodiment. FIG. 4 is a plan view of the clamping section according to the first embodiment. FIG. 5 is a side view of the clamping section according to the first embodiment.

A cutting apparatus 1-1 (an example of a processing apparatus) according to this embodiment includes a cutting unit 20 (an example of a processing unit) having a cutting blade 21, and a chuck table 10 that holds a workpiece 100 (illustrated in FIG. 2), and these are relatively moved to perform cutting of the workpiece 100.

Further, the cutting apparatus 1-1 includes a cassette 30 that accommodates the workpieces 100 before and after cutting, temporary placing means 40 for temporarily placing the workpieces 100 before and after cutting, a cleaning unit 50 for cleaning the workpiece W after the cutting, and a control unit 1000. Furthermore, the cutting apparatus 1-1 includes an X axis moving mechanism (not illustrated) for putting the chuck table 10 and the cutting unit 20 into relative movement in the X axis direction, a Y axis moving mechanism (not illustrated) for putting the chuck table 10 and the cutting unit 20 into relative movement in the Y axis direction, and a Z axis moving mechanism (not illustrated) for putting the chuck table 10 and the cutting unit 20 into relative movement in the Z axis direction.

Here, the workpiece 100 is a plate-shaped object to be processed by the cutting apparatus 1-1, and, in the first embodiment, the workpiece 100 is, for example, a semiconductor wafer or an optical device wafer having a plurality of devices partitioned by orthogonally intersecting streets. The workpiece 100 is divided into individual device chips by a process in which the chuck table 10 and the cutting unit 20 having the cutting blade 21 are put into relative movement, to perform cutting along the streets. Besides, in the first embodiment, the workpiece 100 depicted in FIG. 2 constitutes a frame unit 104 that is held on the inside of an annular frame 102 through a dicing tape 101. The dicing tape 101 is adhered to a back surface on the side opposite to a front surface 103 of the workpiece 100 where the devices are formed, and is adhered to the annular frame 102 surrounding the workpiece 100.

The cassette 30 (an example of a cassette) is placed on a cassette base 29 provided to be liftable in the vertical direction, and accommodates a plurality of the workpieces 100. The cassette 30 is provided with a pair of side walls 31 facing each other, a bottom surface 32 connecting the side surfaces 31, and a plurality of pairs of shelves 33 which project inward from the side walls 31 and on which the workpieces 100 are placed. Temporary placing means 40 is for taking out one of the workpieces 100 before cutting from the cassette 30, and for accommodating the workpiece 100 after cutting into the cassette 30. The temporary placing means 40 is configured to include a conveying unit 41 that conveys the workpiece 100 into and out of the cassette 30, and a pair of rails 42 on which the workpiece 100 is temporarily placed.

The conveying unit 41 includes a clamping section 411 that clamps the workpiece 100, and a conveying arm 412 that enables the clamping section 41 to be moved in a height direction (Z axis direction) and directions for advancing toward and retracting away from the cassette 30 (Y axis direction).

The clamping section 411 includes a support section 421, a presser section 422, and driving means 423. The support section 421 supports a lower surface (back surface) of the workpiece 100 (frame unit 104). The presser section 422 makes contact with an upper surface (front surface 103) of the workpiece 100, and clamps the workpiece 100 between itself and the support section 421. The driving means 423 moves the support section 421 in the vertical direction (Z axis direction) to relatively move the support section 421 and the presser section 422 away from and toward each other.

The conveying unit 41 is fixed to the clamping section 411 as illustrated in FIG. 3, and is disposed at the same height as the height when the clamping section 411 clamps the workpiece 100. A light reflection type sensor 424 is provided which irradiates the workpiece 100 accommodated in the cassette 30 with light. In the present embodiment, the light reflection type sensor 424 is fixed to that part of the clamping section 411 which is not moved by the driving means 423. The light reflection type sensor 424 includes an optical sensor making irradiation and a light receiving section receiving reflected light of the light irradiated. The light L1 applied from the light reflection type sensor 424 is reflected, for example, by a side surface (work edge) in the vertical direction (Z axis direction) of the annular frame 102, and is detected by the light receiving section. Note that the light L1 applied from the light reflection type sensor 424 may not be applied onto the side surface (work edge) of the annular frame 102 but may be applied spreading to the vicinity of the side surface (work edge).

Figure 6:
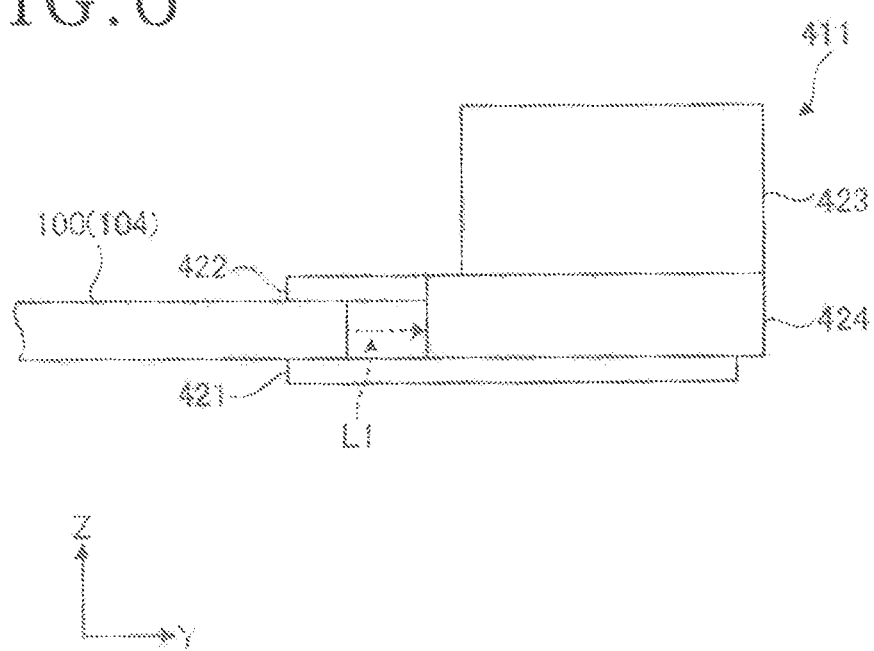
FIG. 6 is a side view depicting an example of a clamping state by the clamping section according to the first embodiment.

FIG. 6 is a diagram depicting an example of a clamping state by the clamping section according to the first embodiment. The control unit 1000 directly monitors (detects) the workpiece 100 by the light reflection type sensor 424. As depicted in FIG. 6, the clamping section 411, under the control of the control unit 1000, relatively moves the support section 421 and the presser section 422 toward each other by the driving means 423, thereby clamping the workpiece 100 (frame unit 104) accommodated in the cassette 30. In this way, the control unit 1000 can directly monitor (detect) the workpiece 100 by the light reflection type sensor 424, and can clamp the workpiece 100 by the clamping section 411.

The chuck table 10 is a table to which the workpiece 100 before cutting on the rails 42 of the temporary placing means 40 is conveyed by a conveying unit 81, and which holds the workpiece 100 adhered to the opening of the annular frame 102 through the dicing tape 101. The chuck table 10 has a structure in which the part constituting a front surface is disk-shaped from a porous ceramic or the like, is connected to a vacuum suction source, not illustrated, through a vacuum suction passage, not illustrated, and suction holds the workpiece W placed on the front surface. Note that the chuck table 10 is provided to be movable in the X axis direction by the X axis moving mechanism, and to be rotatable around a center axis (parallel to the Z axis) by a rotational drive source (not illustrated).

The cutting unit 20 is for cutting the workpiece 100 held by the chuck table 10. The cutting unit 20 is provided to be movable in the Y axis direction relative to the workpiece 100 held by the chuck table 10 by the Y axis moving mechanism, and is provided to be movable in the Z axis direction by the Z axis moving mechanism. The cutting unit 20 is configured to include, for example, the cutting blade 21 which is an extremely thin grinding wheel having a substantially ring-like shape and which is for cutting the workpiece 100 by being rotated by a spindle (not illustrated).

The cleaning unit 50 is for cleaning the workpiece 100 having undergone cutting by the cutting unit 20. The cleaning unit 50 includes a spinner table 51 and a cleaning nozzle (not illustrated). The spinner table 51 holds the workpiece 100 after the cutting. The workpiece 100 after the cutting is conveyed from on the chuck table 10 by a conveying unit 82. The spinner table 51 has a structure in which a part constituting a front surface has a disk-like shape formed from a porous ceramic or the like, is connected to a vacuum suction source, not illustrated, through a vacuum suction passage, not illustrated, and suction holds the workpiece 100 placed on the front surface. The spinner table 51 is rotated around a center axis (parallel to the Z axis) by a rotating force generated by a spinner table drive source (not illustrated). The cleaning nozzle supplies a cleaning liquid to the front surface 103 of the workpiece 100 held by the spinner table 51.

The control unit 1000 (an example of a data processing section) controls the above-mentioned components (mechanisms) constituting the cutting apparatus 1-1, to cause the cutting apparatus 1-1 to cut the workpiece 100. Note that the control unit 1000 is configured to include an arithmetic processing apparatus including, for example, a central processing unit (CPU) or a micro-processing unit (MPU), a storage apparatus such as a read only memory (ROM) or a random access memory (RAM), and the like. The control unit 1000 is connected, for example, to a touch panel provided with display means and operating means, not illustrated, used when the operator registers processing contents information or the like.

The control unit 1000 according to the first embodiment includes a presence/absence determining section 1001, a clamping light amount recording section 1002, a draw-out light amount recording section 1003, and a draw-out determining section 1004, and, by these sections, performs various processes concerning the cutting apparatus 1-1 according to the first embodiment described below. Each of the sections of the control unit 1000 is realized by a function provided by a program stored in the storage apparatus, for example. In other words, each of the sections of the control unit 1000 is realized by a process in which the arithmetic processing apparatus executes the program stored in the storage apparatus by using the RAM and the like as a work area.

(Detecting Operation for Workpiece)

Figure 7:
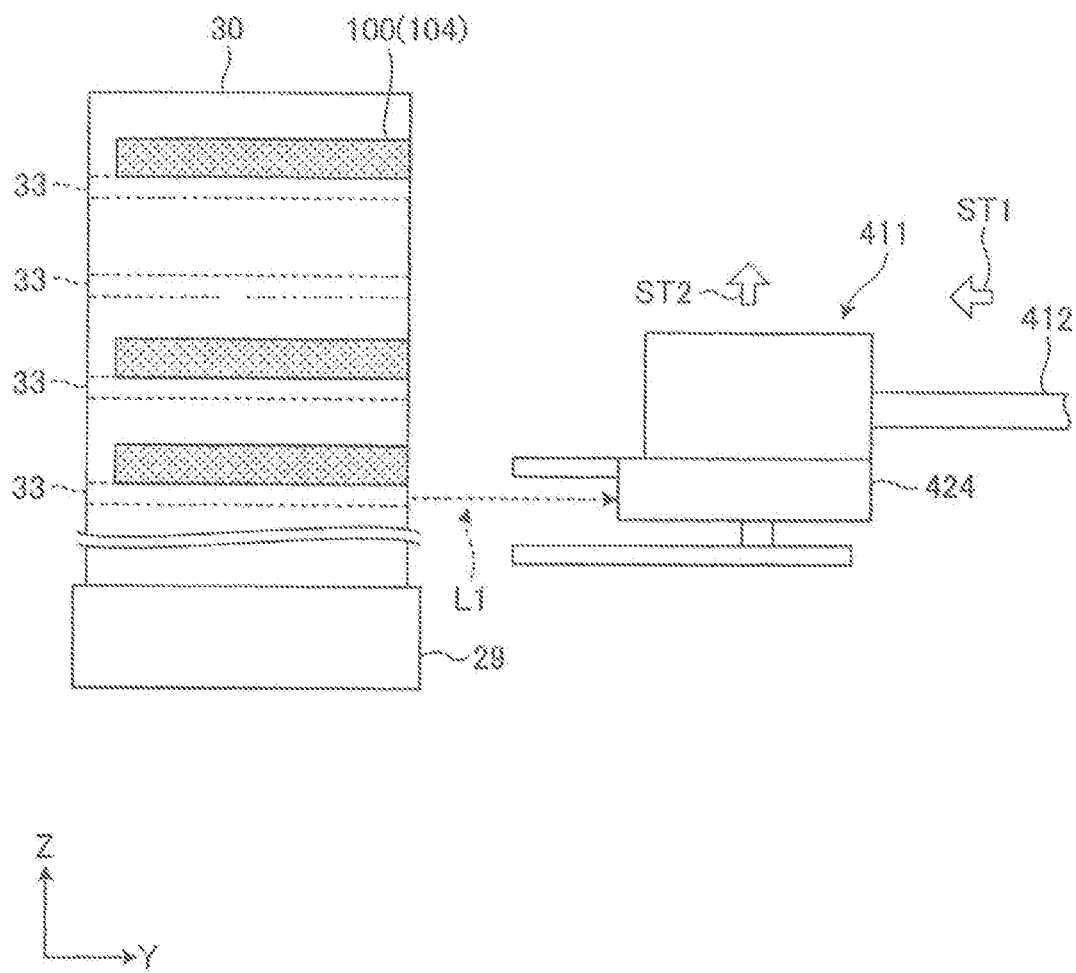
FIG. 7 is a schematic side view depicting an outline of a detecting operation according to the first embodiment.

A detecting operation for the workpiece 100 according to the first embodiment will be described. FIG. 7 is a schematic diagram depicting an outline of the detecting operation according to the first embodiment. FIG. 7 is a view, from a lateral side, of the positional relationship between the cassette 30 and the clamping section 411. In the following, the workpiece 100 may be referred to as the frame unit 104, and the frame unit 104 may be referred to as the workpiece 100.

First, the cassette base 29 on which the cassette 30 is placed is raised to a predetermined position. The presence/absence determining section 1001 of the control unit 1000 drives the conveying arm 412, to move the clamping section 411 in a horizontal direction (Y axis direction) (ST1), thereby positioning the clamping section 411 at a position close to a predetermined position relative to the cassette 30. Subsequently, the presence/absence determining section 1001 drives the conveying arm 412, to move the clamping section 411 upward in the vertical direction (Z axis direction) (ST2), and while doing so, drives the light reflection type sensor 424, to apply light L1 toward the cassette 30. While moving vertically attendant on the movement of the clamping section 411, the light reflection type sensor 424 irradiates the frame units 104 accommodated on the shelves 33 of the cassette 30 with light.

In the case where reflected light is below a preset threshold, the presence/absence determining section 1001 determines that the workpiece 100 is absent on the relevant shelf 33. Specifically, while moving the clamping section 411 upward in the vertical direction, the presence/absence determining section 1001 acquires the amount of reflected light detected by the light receiving section of the light reflection type sensor 424, and compares the thus acquired amount of reflected light with a predetermined threshold. Then, until the clamping section 411 reaches an upper portion of the cassette 30, the presence/absence determining section 1001 determines that the workpiece 100 (frame unit 104) is accommodated in the cassette 30 on a stage where the amount of reflected light exceeds the predetermined threshold.

(Draw-Out Determining Operation for Workpiece)

Figure 8:
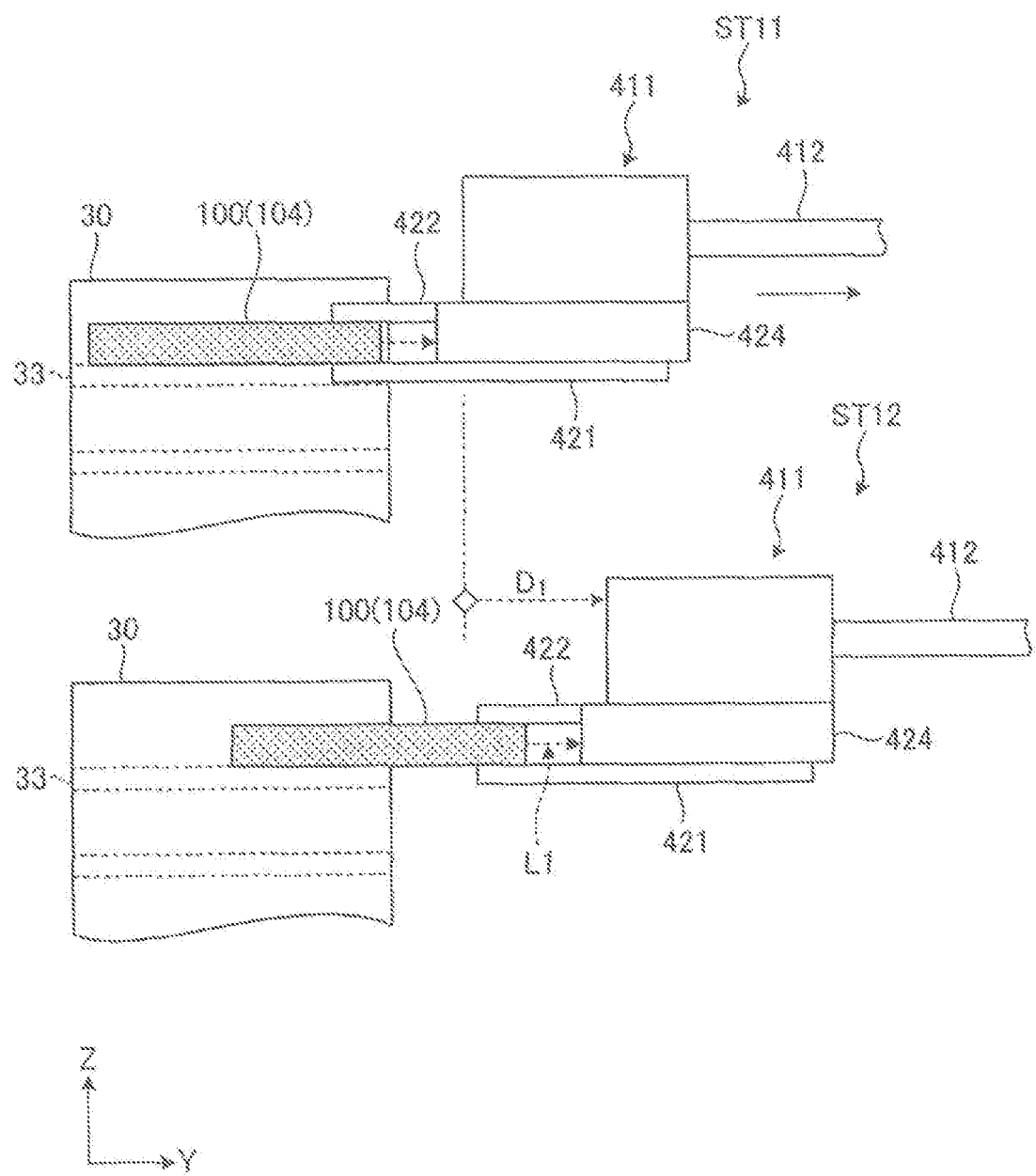
FIG. 8 is a side view schematically depicting an outline of a draw-out determining operation for a workpiece according to the first embodiment.
Figure 9:
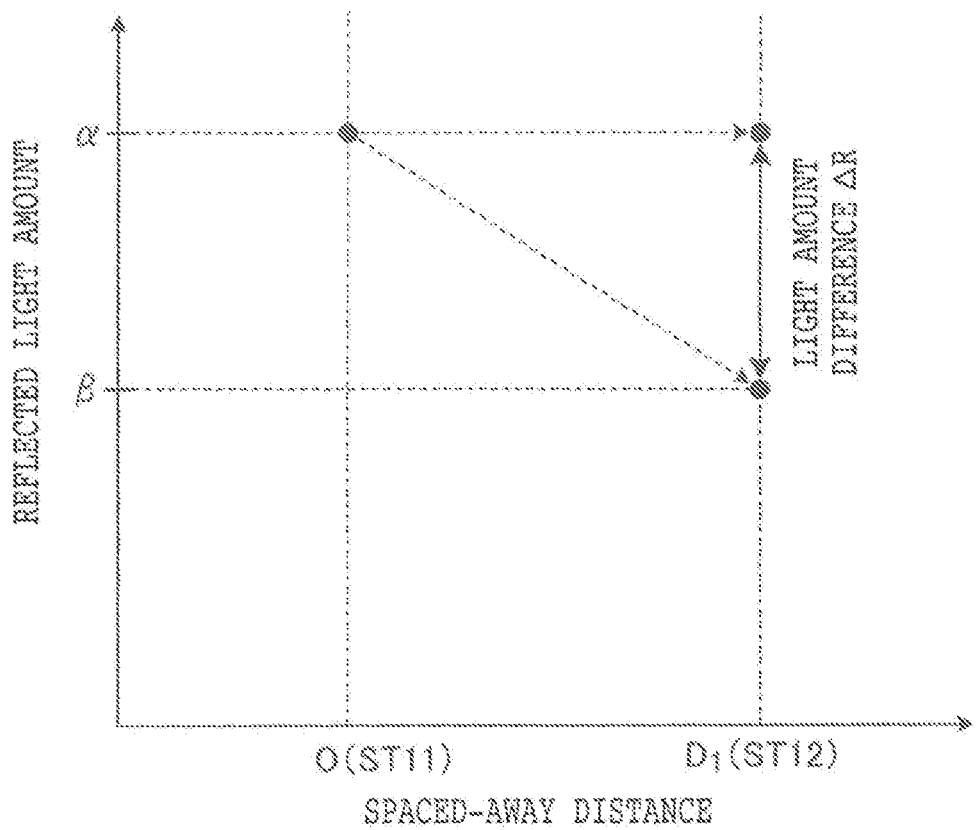
FIG. 9 is a diagram depicting an example of the relation between a spaced-away distance and reflected light amount according to the first embodiment.

A detecting operation for the workpiece 100 according to the first embodiment will be described. FIG. 8 is a diagram schematically depicting an outline of a draw-out determining operation for the workpiece according to the first embodiment. FIG. 8 is a view, from a lateral side, of the positional relationship between the cassette and the clamping section. FIG. 9 is a diagram depicting an example of the relationship between spaced-away distance and reflected light amount according to the first embodiment.

First, the clamping light amount recording section 1002 of the control unit 1000 drives the conveying arm 412, to move the clamping section 411 while irradiating with light from the light reflection type sensor 424, and positions the clamping section 411 at such a position as to be able to clamp the frame unit 104 (workpiece 100). Then, the clamping light amount recording section 1002 records the reflected light amount at a stage where the clamping section 411 clamps the frame unit 104 accommodated in the cassette 30 (ST11). Note that in the following, description will be made while rephrasing the reflected light amount at the stage where the clamping section 411 clamps the frame unit 104 as the reflected light amount when the spaced-away distance of the frame unit 104 is "0 (zero)."

The draw-out light amount recording section 1003 of the control unit 1000 records the reflected light amount at a stage where the clamping section 411 is spaced away from the cassette 30 for drawing out the frame unit 104 (workpiece 100) from the cassette 30 (ST12). For example, the draw-out light amount recording section 1003 records the reflected light amount at a stage where the clamping section 411 has been moved by a distance D1 in a horizontal direction (Y axis direction), with the stage of clamping the frame unit 104 as a start point. Note that in the following description, the reflected light amount at the stage where the clamping section 411 has been moved by the distance D1 in the horizontal direction from the stage of clamping the frame unit 104 may be rephrased as the reflected light amount when the spaced-away distance of the frame unit 104 is "D1."

The draw-out determining section 1004 of the control unit 1000 determines that the frame unit 104 (workpiece 100) has not been drawn out suitably when the difference between the light amounts recorded in the clamping light amount recording section 1002 and the draw-out light amount recording section 1003 exceeds a threshold. In other words, in the case where the frame unit 104 is suitably clamped by the clamping section 411 at a stage after the frame unit 104 is drawn out, the light L1 applied from the light reflection type sensor 424 continues to be reflected from a side surface (work edge) in the vertical direction of the annular frame 102. For this reason, as illustrated in FIG. 9, it is supposed that the reflected light amount detected by the light reflection type sensor 424 becomes substantially constant. On the other hand, in the case where the frame unit 104 is not clamped easily such as being detached from the clamping section 411 at a stage after the frame unit 104 is drawn out, the light L1 applied from the light reflection type sensor 424 is not reflected by an obstacle such as the annular frame 102. It is supposed that the reflected light amount detected by the light reflection type sensor 424 is lowered for this reason.

In view of this, the draw-out determining section 1004 calculates light amount difference ΔR between the reflected light amount α when the spaced-away distance of the frame unit 104 is "0" and the reflected light amount β when the spaced-away distance of the frame unit 104 is "D1." In the case where the light amount difference ΔR is in excess of a predetermined threshold, the draw-out determining section 1004 determines that the frame unit 104 (workpiece 100) has not been drawn out suitably.

Figure 10:
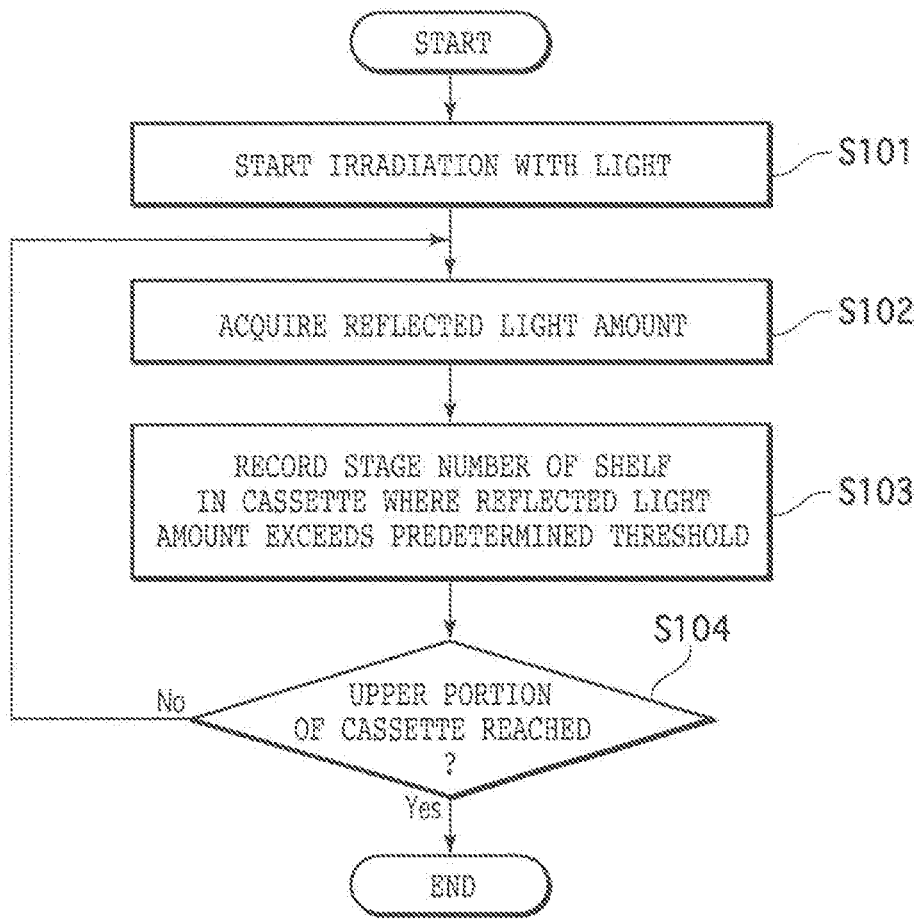
FIG. 10 is a flow chart depicting an example of processing of the cutting apparatus according to the first embodiment.
Figure 11:
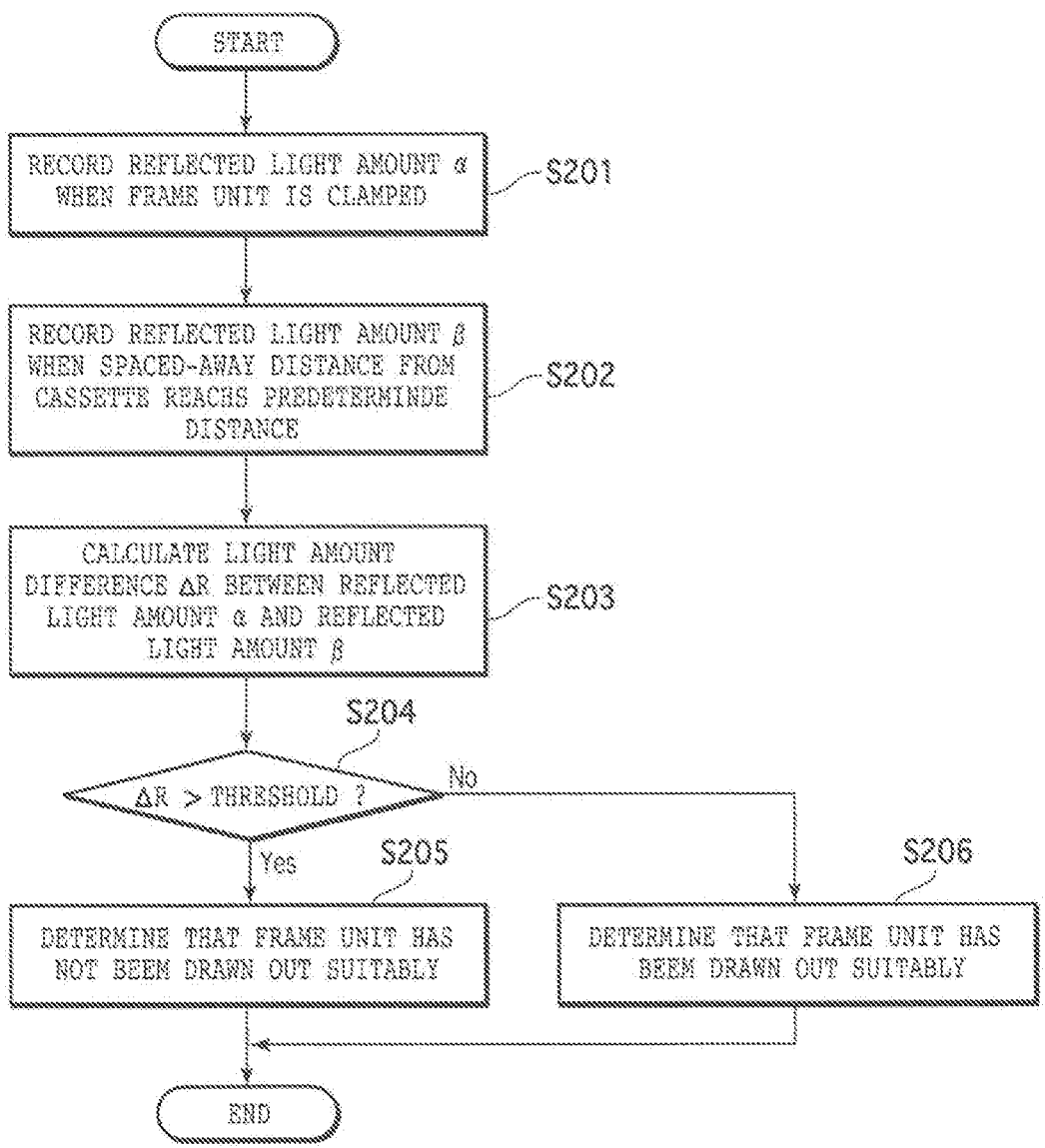
FIG. 11 is a flow chart depicting an example of processing subsequent to the flow chart of FIG. 10 of the cutting apparatus according to the first embodiment.

Using FIGS. 10 and 11, an example of processing by the cutting apparatus 1-1 according to the first embodiment will be described. FIGS. 10 and 11 are flow charts depicting an example of processing by the cutting apparatus 1-1 according to the first embodiment. The processing by the cutting apparatus 1-1 denoted in FIGS. 10 and 11 is carried out by the sections possessed by the control unit 1000.

(Presence/Absence Determining Process)

As depicted in FIG. 10, after the clamping section 411 is positioned at a position of being brought to a close position relative to the cassette 30, the presence/absence determining section 1001 starts irradiation with light from the light reflection type sensor 424 while moving the clamping section 411 upward in the vertical direction (step S101).

Subsequently, the presence/absence determining section 1001 acquires a reflected light amount detected by the light reflection type sensor 424 (step S102), and records the stage number of the shelf 33 of the cassette 30 where the reflected light amount exceeds a predetermined threshold (step S103). In other words, the presence/absence determining section 1001 determines that the workpiece 100 is accommodated on the stage number of the shelf 33 of the cassette 30 where the reflected light amount exceeds the predetermined threshold.

The presence/absence determining section 1001 determines whether or not an upper portion of the cassette 30 has been reached (step S104). In the case where it is determined that the upper portion of the cassette 30 has not been reached (step S104: No), the presence/absence determining section 1001 returns to the procedure of step S102. On the other hand, in the case where it is determined that the upper portion of the cassette 30 has been reached (step S104: Yes), the presence/absence determining section 1001 finishes the process depicted in FIG. 10.

(Draw-Out Determining Process)

As depicted in FIG. 11, the clamping light amount recording section 1002 records the reflected light amount α when the frame unit 104 is clamped (step S201). The draw-out light amount recording section 1003 records the reflected light amount β when the spaced-away distance of the frame unit 104 from the cassette 30 reaches a predetermined distance (step S202).

The draw-out determining section 1004 calculates the light amount difference ΔR between the reflected light amount α and the reflected light amount β (step S203). The draw-out determining section 1004 determines whether or not the light amount difference ΔR exceeds a predetermined threshold (step S204).

In the case where it is determined that the light amount difference ΔR exceeds the predetermined threshold (step S204: Yes), the draw-out determining section 1004 determines that the frame unit 104 has not been drawn out suitably (step S205), and finishes the process depicted in FIG. 11.

On the other hand, in the case where it is determined that the light amount difference ΔR does not exceed the predetermined threshold (step S204: No), the draw-out determining section 1004 determines that the frame unit 104 has been drawn out suitably (step S206), and finishes the process depicted in FIG. 11.

In the cutting apparatus 1-1 (an example of processing apparatus) according to the first embodiment, the conveying unit 41 includes the light reflection type sensor 424. The light reflection type sensor 424 is fixed to the clamping section 411. The position of the light reflection type sensor 424 is adjusted when the light reflection type sensor 424 is fixed to the clamping section 411 at the same height as the height when the clamping section 411 clamps the workpiece 100. The light reflection type sensor 424 irradiates the workpiece 100 accommodated in the cassette 30 with light. As a result, it is possible to provide a cutting apparatus 1-1 which can determine the presence or absence of the workpiece 100 accommodated on each stage in the cassette 30 and whether or not the workpiece 100 has been drawn out suitably after the workpiece 100 was clamped, based on, for example, the results of detection by one light reflection type sensor 424.

In addition, in the cutting apparatus 1-1 (an example of processing apparatus) according to the first embodiment, the control unit 1000 (an example of data processing section) includes the presence/absence determining section 1001 that determines, in the case where the reflected light is below a preset threshold, that the workpiece 100 is absent on the relevant shelf (for example, the shelf 33). As a result, it is possible to provide a cutting apparatus 1-1 which can easily determine the presence or absence of the workpiece 100 accommodated on each stage (for example, on the shelf 33) in the cassette 30, based on the results of detection by the light reflection type sensor 424.

Besides, in the cutting apparatus 1-1 (an example of processing apparatus) according to the first embodiment, the control unit 1000 (an example of data processing section) includes the clamping light amount recording section 1002, the draw-out light amount recording section 1003, and the draw-out determining section 1004. The clamping light amount recording section 1002 records the reflected light amount at a stage where the workpiece 100 accommodated in the cassette 30 is clamped by the clamping section 411. The draw-out light amount recording section 1003 records the reflected light amount at a stage where the clamping section 411 is spaced away from the cassette 30 for drawing out the workpiece 100 from the cassette 30. The draw-out determining section 1004 determines that the workpiece 100 has not been drawn out suitably, in the case where the difference between the light amounts recorded in the clamping light amount recording section 1002 and the draw-out light amount recording section 1003 exceeds a threshold. As a result, it is possible to provide a cutting apparatus 1-1 which can easily determine whether or not the workpiece 100 has been drawn out suitably after the workpiece 100 was clamped, based on the results of detection by the light reflection type sensor 424.

Second Embodiment

Figure 12:
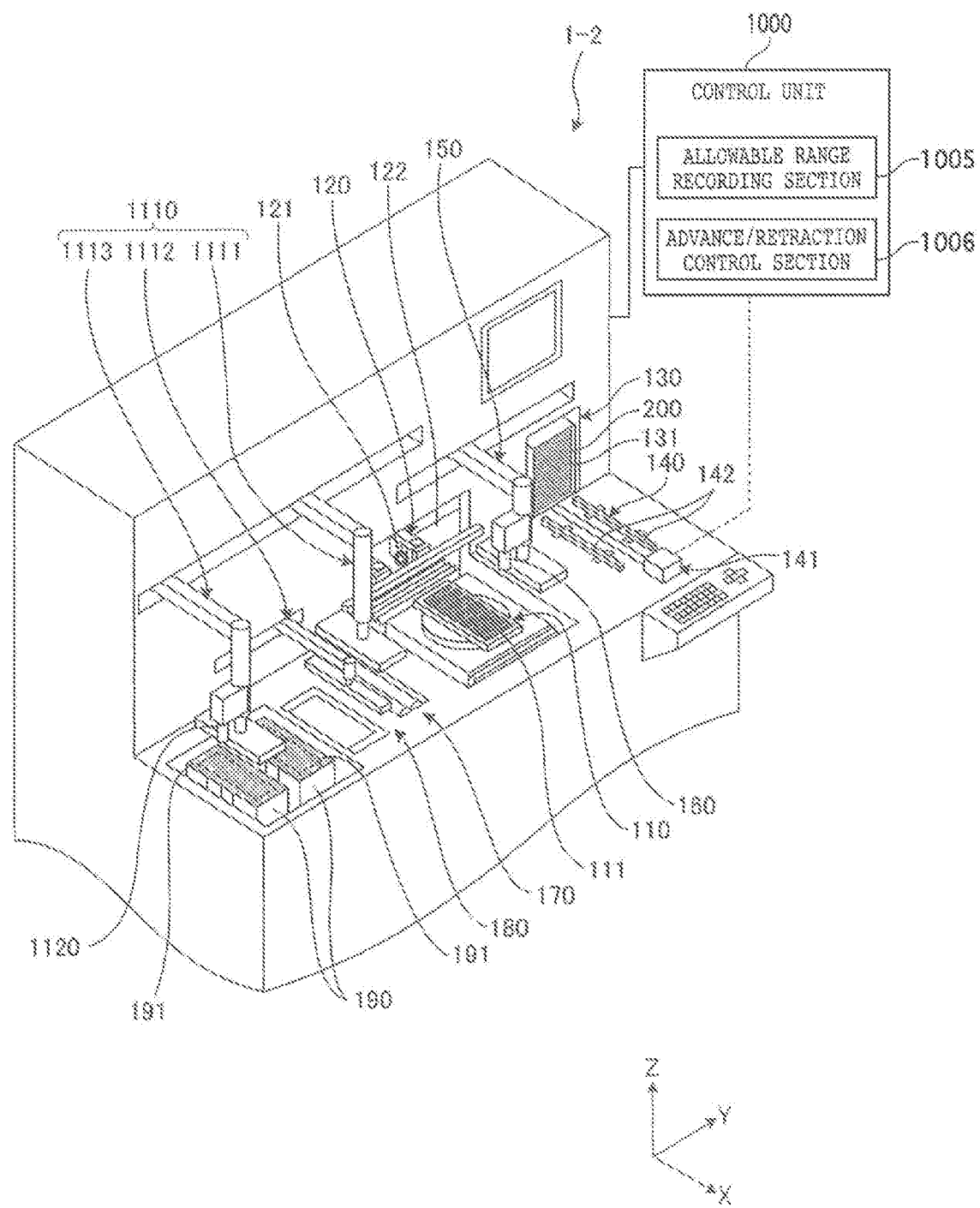
FIG. 12 is a perspective view depicting a configuration example of a cutting apparatus according to a second embodiment.
Figure 13:
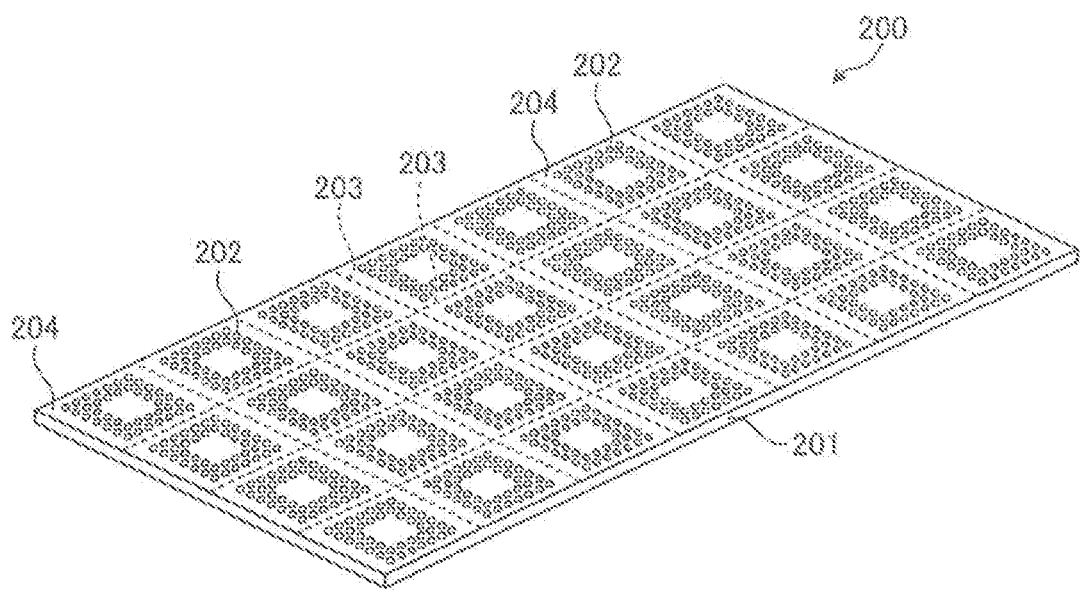
FIG. 13 is a perspective view depicting an example of a workpiece according to the second embodiment.
Figure 14:
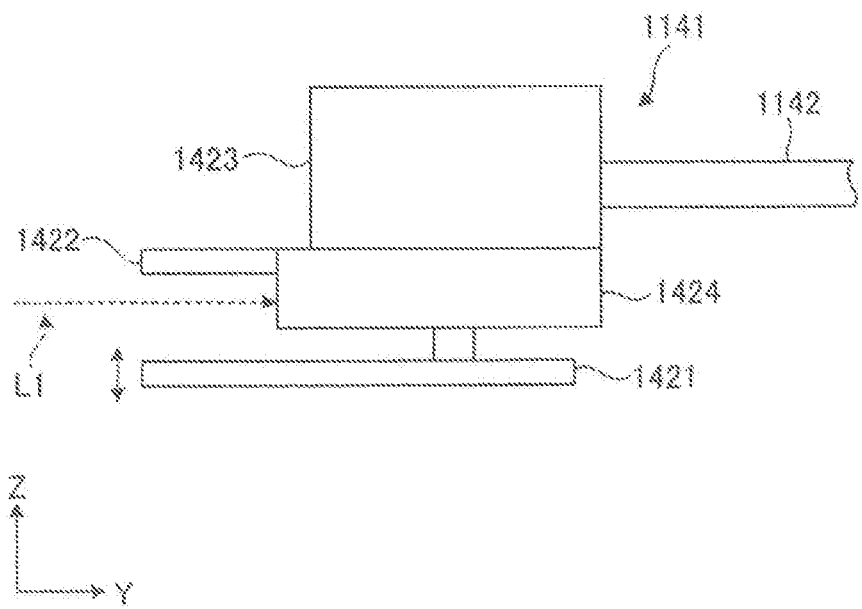
FIG. 14 is a side view of a clamping section according to the second embodiment.

In a second embodiment which follows, an operation of a cutting apparatus 1-2 for cutting a package substrate will be described. FIG. 12 is a perspective view depicting a configuration example of a cutting apparatus according to the second embodiment. FIG. 13 is a perspective view depicting an example of a workpiece according to the second embodiment. FIG. 14 is a side view of a clamping section according to the second embodiment.

The cutting apparatus 1-2 (an example of processing apparatus) illustrated in FIG. 12 is an apparatus for cutting a workpiece 200 depicted in FIG. 13. As illustrated in FIG. 13, the workpiece 200 is formed in the shape of a flat plate which is rectangular in plan view shape. The workpiece 200 depicted in FIG. 12 is a what is called package substrate having a structure in which a plurality of semiconductor chips are mounted on and bonded to a frame substrate 201 such as a lead frame, and each of the semiconductor chips is sealed with a resin.

Electrodes of each semiconductor chip are connected to a plurality of bumps 202. A plurality of streets 203 are formed in a grid pattern on a front surface of the workpiece 200, and the semiconductor chips are mounted on regions partitioned by the streets 203. The workpiece 200 configured as aforementioned is cut along the streets 203 by the cutting apparatus 1-2 depicted in FIG. 12, whereby the workpiece 200 is divided into individual device chips (corresponding to chips) 204.

The cutting apparatus 1-2 illustrated in FIG. 12 includes a holding table 110, a cutting unit 120, and a control unit 1000. The holding table 110 is formed in a rectangular shape, and has a holding surface 111 for holding the workpiece 200. The holding surface 111 is provided with suction ports, not illustrated, for sucking the workpiece 200 and the device chips 204, and relief grooves, not illustrated, for relieving a cutting blade 21. The suction ports are provided at such positions as to overlap with the device chips 204, and are opening to the holding surface 111. The relief grooves are provided at positions corresponding to the streets 203, and are formed to be recessed from the holding surface 111.

The holding table 110 has the suction ports connected to a vacuum suction source not illustrated, and has the suction ports sucked by the vacuum suction source, whereby the workpiece 200 is suction held onto the holding surface 111. In addition, the holding table 110 is provided to be movable in an X axis direction by a processing feeding unit not illustrated, and to be rotatable around an axis parallel to a Z axis direction by a rotational drive source not illustrated.

The cutting unit 120 (an example of processing unit) cuts the streets 203 of the workpiece 200 suction held onto the holding table 110 by a cutting blade 121, to divide the workpiece 200. The cutting unit 120 includes a spindle, not illustrated, to which the cutting blade 121 for cutting the workpiece 200 held by the holding table 110 is mounted.

The cutting blade 121 is an extremely thin grinding wheel having a substantially ring-like shape. The spindle rotates the cutting blade 121, thereby cutting the workpiece 200. The spindle is accommodated in a spindle housing 122. The axes of the spindle and the cutting blade 121 of the cutting unit 120 are set parallel to a Y axis direction.

The cutting unit 120 is provided to be movable in the Y axis direction, relative to the workpiece 200 held by the holding table 110, by an indexing feeding unit not illustrated, and is provided to be movable in the Z axis direction by a cutting-in feeding unit not illustrated. The cutting unit 120 is set such that the cutting blade 121 can be positioned at any position on the holding surface 111 of the holding table 110 by the indexing feeding unit and the cutting-in feeding unit. The cutting unit 120, by being moved in the Y axis direction and the Z axis direction by the indexing feeding unit and the cutting-in feeding unit, cuts the streets 203 of the workpiece 200 held by the holding table 110 moved in the X axis direction by a processing feeding unit, thereby to divide the workpiece 200 into a plurality of device chips 204.

In addition, the cutting apparatus 1-2 illustrated in FIG. 12 includes a cassette 130, a package conveying-out unit 140, a package conveying unit 150, an imaging unit 160, a cleaning unit 170, a drying unit 180, and an accommodating tray placing section 190.

The cassette 130 (an example of cassette) accommodates a plurality of workpieces 200 yet to be processed. The cassette 130 stacks the plurality of workpieces 200 with spacings therebetween in the Z axis direction. The cassette 130 is provided with an opening 131 that permits the workpiece 200 to be put in and out therethrough. The cassette 130 is provided to be liftable up and down in the Z axis direction by a cassette elevator not illustrated.

The package conveying-out unit 140 includes conveying-out means 141 (an example of conveying unit) taking out the workpieces 200 yet to be processed from the cassette 130 one sheet at a time, and a pair of rails 142 on which the workpiece 200 taken out from the cassette 130 is temporarily placed. The conveying-out means 141 has a configuration similar to that of the conveying unit 41 according to the first embodiment, and includes a clamping section 1141 (an example of clamping section) and a conveying arm 1142 (an example of conveying arm), as depicted in FIG. 14. The clamping section 1141 includes a support section 1421, a presser section 1422, and driving means 1423. In addition, the conveying-out means 141 includes a light reflection type sensor 1424 that irradiates the workpiece 200 accommodated in the cassette 130 with light, the light reflection type sensor 1424 being fixed to the clamping section 1411 and being disposed at the same height as the height when the clamping section 1411 holds the workpiece 200. Note that in the first and second embodiments, the position of the light reflection type sensor (424, 1424) is adjusted at such a position as to be the same height as the height when the clamping section (411, 1141) clamps the workpiece (100, 200). However, this height corresponds to a height between the support section (421, 1421) and the presser section (422, 1422), and the position of the presser section (422, 1422) varies depending on the workpiece (100, 200) clamped. Therefore, the same height as the height when the clamping section (411, 1411) clamps the workpiece 200 is the position (height) such that light is applied to the workpiece (100, 200) supported by the support section (421, 1421), with the support section (421, 1421) as a reference. Besides, the light reflection type sensor (424, 1424) may include a mechanism by which the position and region of light applied can be adjusted.

The package conveying unit 150 conveys the workpiece 200 yet to be processed, which is taken out from the cassette 130, to the holding table 110. The imaging unit 160 images the workpiece 200 yet to be processed, to acquire an image for alignment. The cleaning unit 170 cleans lower surfaces of the individually divided device chips 204. The drying unit 180 dries the device chips 204 cleaned by the cleaning unit 170. The accommodating tray placing section 190 places an accommodating tray not illustrated.

In addition, the cutting apparatus 1-2 illustrated in FIG. 12 includes a conveying unit 1110 and a tray imaging unit 1120. The conveying unit 1110 is for conveying the cut workpiece 200, or the plurality of device chips 204, from the holding table 110 to the accommodating tray not illustrated. The conveying unit 1110 includes a first conveying unit 1111, a second conveying unit 1112, and a third conveying unit 1113. The first conveying unit 1111 conveys the cut workpiece 200, or the plurality of cut device chips 204, from the holding table 110 to the cleaning unit 170. The second conveying unit 1112 conveys the cleaned workpiece 200, or the plurality of cleaned device chips 204, from the cleaning unit 170 to the drying unit 180. The third conveying unit 1113 conveys the dried workpiece 200, or the plurality of dried device chips 204, from the drying unit 180 to the accommodating tray, not illustrated, which is placed on an upper surface 191 on one side of the accommodating tray placing section 190.

The tray imaging unit 1120 images the accommodating tray, not illustrated, which is placed on the upper surface 191 of the accommodating tray placing section 190 before accommodating the workpiece 200, to acquire an image of the accommodating tray not illustrated.

Besides, the cutting apparatus 1-2 depicted in FIG. 12 includes a control unit 1000. The control unit 1000 according to the second embodiment includes an allowable range recording section 1005 and an advance/retraction control section 1006, and, by these sections, carries out various processes of the cutting apparatus 1-2 according to the second embodiment described below.

For example, at the time of bringing the workpiece 200 (FIG. 13) into or out of the cassette 130, for avoiding damaging or the like of the device chips 204, contact of the clamping section 1141 with the device chips 204 should be avoided. In view of this, the allowable range recording section 1005 records the correlation between the length of insertion of the workpiece 200 into the clamping section 1141 in a state in which the support section 1421 and the presser section 1422 are spaced away from each other and reflected light amount corresponding to the respective length. The allowable range recording section 1005 records as an allowable range the range of the reflected light amount corresponding to a length allowable as a length of insertion of the workpiece 200 into the clamping section 1141 such that the clamping section 1141 does not contact the device chips 204 when the clamping section 1141 clamps the workpiece 200.

Figure 15:
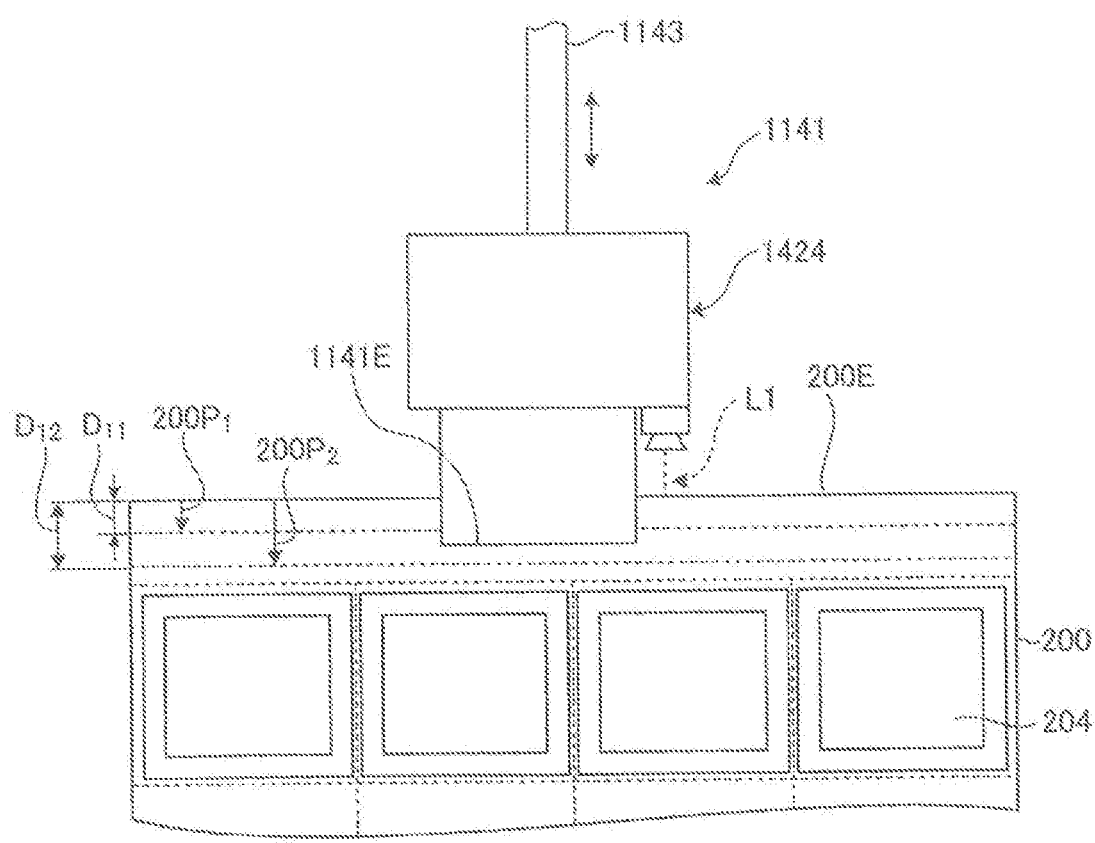
FIG. 15 is a schematic diagram depicting an example of the positional relationship between a tip portion of the clamping section and an end portion of the workpiece according to the second embodiment.
Figure 16:
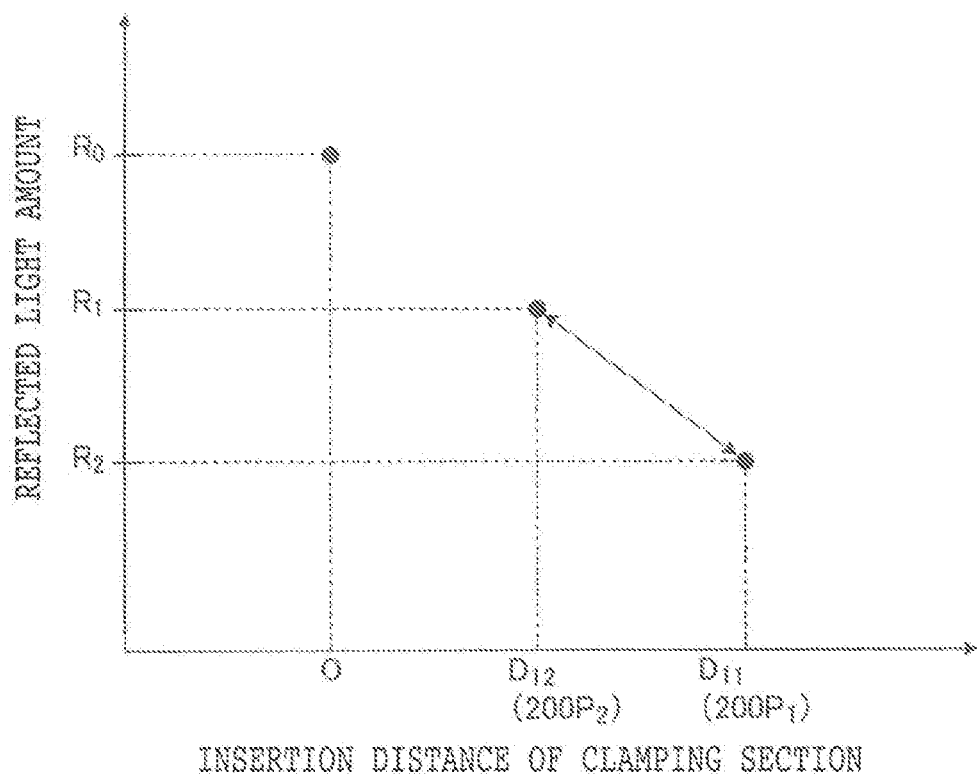
FIG. 16 is a diagram depicting the corresponding relationship between an insertion distance of the clamping section and reflected light amount according to the second embodiment.

FIG. 15 is a schematic diagram depicting an example of the positional relation between a tip portion of the clamping section and an end portion of the workpiece according to the second embodiment. FIG. 16 is a diagram depicting an example of the corresponding relationship between insertion distance of the clamping section and reflected light amount according to a modification.

As depicted in FIG. 15, by moving the conveying arm 1143, the clamping section 1141 is inserted into the workpiece 200 in such a manner that the workpiece 200 is interposed between the support section 1421 and the presser section 1422. In this instance, for example, it is assumed that the range from a position 200P1 of the workpiece 200 depicted in FIG. 15 to a position 200P2 not reaching the device chip 204 is a length allowable as a length of insertion of the clamping section 1141 into the workpiece 200. In this case, as depicted in FIG. 16, the range of reflected light amount (R2<reflected light amount<R1) corresponding to an insertion length from an insertion length D11 to an insertion length D12 of the clamping section 1141 is preliminarily measured as an allowable range, and is preliminarily recorded in the allowable range recording section 1005. The insertion length D11 indicates an insertion length when a tip portion 1141E of the clamping section 1141 reaches the position 200P1 of the workpiece 200. The insertion length D12 indicates an insertion length when the tip portion 1141E of the clamping section 1141 reaches the position 200P2 of the workpiece 200. The insertion length corresponds to the distance between the tip portion 1141E of the clamping section 1141 and an end portion 200E of the workpiece 200. By the corresponding relationship depicted in FIG. 16, whether or not the clamping section 1141 is present in the range from the insertion length D11 to the insertion length D12 of the clamping section 1141 can be grasped based on the reflected light amount detected by the light reflection type sensor 1424.

The advance/retraction control section 1006 controls advance/retraction of the clamping section 1141 in such a manner that, when the workpiece 200 is conveyed into or out of the cassette 130, the range of the reflected light amount detected by the light reflection type sensor 1424 is the allowable range recorded in the allowable range recording section 1005. As a result, the advance/retraction control section 1006 can clamp by the clamping section 1141 such a position of the workpiece 200 as not to contact the device chips 204 when the workpiece 200 is conveyed into or out of the cassette 130. In other words, under the control of the advance/retraction control section 1006, the clamping section 1141 can clamp the range from the position 200P1 to the position 200P2 of the workpiece 200 that corresponds to the range of insertion length D11 to D12 allowable as an insertion length.

Figure 17:
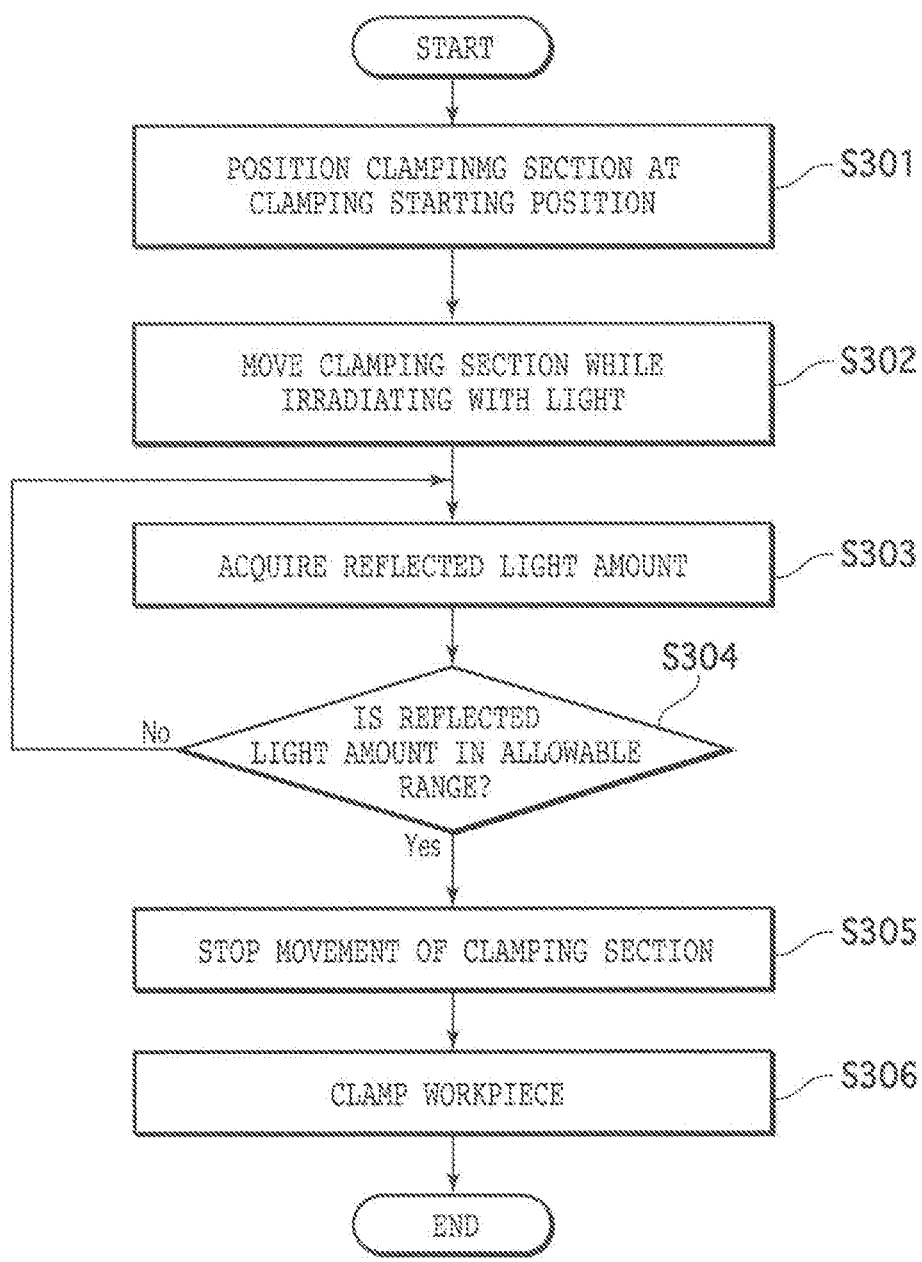
FIG. 17 is a flow chart depicting an example of processing of the cutting apparatus according to the second embodiment.

Referring to FIG. 17, an example of a process by the cutting apparatus 1-2 according to the second embodiment will be described. FIG. 17 is a flow chart depicting an example of the process by the cutting apparatus according to the second embodiment. The process by the cutting apparatus 1-2 depicted in FIG. 17 is an example of advance/retraction control for the clamping section 1141 executed by the advance/retraction control section 1006.

As depicted in FIG. 17, the advance/retraction control section 1006 controls the conveying arm 1143, to position the clamping section 1141 at a preset clamping starting position (step S301). For example, the advance/retraction control section 1006 positions the clamping section 1141 at a position of a predetermined close distance to the cassette 130, at the same height as the height of the stage number of the shelf in the cassette 130 where it is determined that the workpiece 200 is accommodated.

Subsequently, the advance/retraction control section 1006 moves the clamping section 1141 while irradiating with light from the light reflection type sensor 1424 (step S302), and acquires a reflected light amount detected by the light reflection type sensor 1424 (step S303). Subsequently, the advance/retraction control section 1006 determines whether or not the reflected light amount acquired in step S303 is in the allowable range recorded in the allowable range recording section 1005 (step S304).

In the case where it is determined that the reflected light amount acquired in step S303 is in the allowable range (step S304: Yes), the advance/retraction control section 1006 stops movement of the clamping section 1141 (step S305).

Then, the advance/retraction control section 1006 clamps the workpiece 200 by the support section 1421 and the presser section 1422 of the clamping section 1141 (step S306), and finishes the process depicted in FIG. 17.

In step S304 above, in the case where it is determined that the reflected light amount acquired in step S303 is not within the allowable range recorded in the allowable range recording section 1005 (step S304: No), the advance/retraction control section 1006 returns to the procedure of step S303.

In the cutting apparatus 1-2 (an example of processing apparatus) according to the second embodiment, the control unit 1000 (an example of data processing section) includes the allowable range recording section 1005 and the advance/retraction control section 1006. The allowable range recording section 1005 records the correlation between the length of insertion of the workpiece 200 into the clamping section 1141 in a state in which the support section 1421 and the presser section 1422 are spaced away from each other and the reflected light amount corresponding to the respective length. In other words, the allowable range recording section 1005 records as the allowable range a range of the reflected light amount corresponding to a length allowable as a length of insertion of the workpiece 200 into the clamping section 1141 such that the clamping section 1141 does not contact the semiconductor chips when the clamping section 1141 clamps the workpiece 200. The advance/retraction control section 1006 controls the advance/retraction of the clamping section 1141 such that the range of the reflected light amount detected by the light reflection type sensor 1424 is within the allowable range, based on the allowable range recorded in the allowable range recording section 1005, at the time when the workpiece 200 is conveyed into or out of the cassette 130. As a result, it is possible to provide a cutting apparatus 1-2 holding the workpiece 200 at a suitable position, based on the results of detection by one light reflection type sensor 1424, for example.

Note that the process by the control unit 1000 (the allowable range recording section 1005 and the advance/retraction control section 1006) of the cutting apparatus 1-2 according to the second embodiment can be similarly also applied to the case of holding the annular frame 102 of the frame unit 104 in the first embodiment at a suitable position.

Modification of Embodiment

In the second embodiment above, an example in which the advance/retraction control section 1006 controls the advance/retraction of the clamping section 1141 based on the reflected light amount detected by the light reflection type sensor 1424 has been described, but this example is not particularly limitative. For example, the advance/retraction of the clamping section 1141 may be controlled according to the distance between the clamping section 1141 and the workpiece 200. The cutting apparatus 1-2 includes a distance measuring sensor in place of the light reflection type sensor 1424, and the advance/retraction control section 1006 preliminarily measure an allowable distance between the clamping section 1141 and the workpiece 200 which corresponding to a length of insertion allowable for the clamping section 1141. Then, the advance/retraction control section 1006 can control the advance/retraction of the clamping section 1141, based on whether or not the distance measured by the distance measuring sensor is within the allowable distance range.

Other Embodiments

The processing apparatus according to the present invention is not limited to the above embodiments concerning the cutting apparatuses 1-1 and 1-2 described as an example of such processing apparatus, and various modifications can be made within such ranges as not to depart from the gist of the present invention. For example, the processing apparatus according to the present invention may be a laser processing apparatus or a grinding apparatus, insofar as such apparatus is an apparatus that conveys in and out by clamping a disk-shaped or plate-shaped workpiece.

In addition, the components of the cutting apparatuses 1-1 and 1-2 described as an example of the processing apparatus in the above embodiments are functional conceptual ones, and may not necessarily be physically configured as illustrated in the drawings. In other words, a specific form of dispersion or integration of the cutting apparatuses 1-1 and 1-2 is not limited to those illustrated in the drawings, and the whole or part thereof may be configured in the state of being functionally or physically dispersed or integrated in any units, according to various kinds of loads or use conditions. The control unit 1000 may have sections thereof dispersed or integrated, as required, according to the contents of processing by the sections. For example, the allowable range recording section 1005 may be mounted to the cutting apparatus 1-2 in a state of being dispersed from the control unit 1000 on a functional or physical basis.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A processing apparatus comprising:
a holding table that holds a workpiece;
a processing unit that processes the workpiece held by the holding table;
a cassette that is disposed on a cassette base and accommodates a plurality of the workpieces;
a conveying unit that is disposed such as to be insertable into the cassette and conveys the workpiece into and out of the cassette; and
a control unit that controls the holding table, the processing unit and the conveying unit, wherein
the conveying unit includes:
a clamping section that clamps the workpiece,
a conveying arm that enables the clamping section to be moved in a height direction and in directions of advancing toward and retracting away from the cassette, and
a light reflection type sensor that faces the cassette and irradiates the workpiece accommodated in the cassette with light, the light reflection type sensor being fixed to the clamping section and being disposed at a same height as a height when the clamping section clamps the workpiece,
the clamping section includes:
a support section that supports a lower surface of the workpiece,
a presser section that makes contact with an upper surface of the workpiece and clamps the workpiece between itself and the support section, and
driving means that relatively moves the support section and the presser section away from and toward each other.

2. The processing apparatus according to claim 1, wherein the cassette includes:
a pair of side walls facing each other,
a bottom surface connecting the side walls, and
a plurality of pairs of shelves which project inward from the pair of facing side walls and on which the workpieces are respectively placed,
the light reflection type sensor irradiates the workpieces accommodated respectively on the shelves of the cassette with light while moving vertically attendant on a movement of the clamping section, and the control unit includes:
a presence/absence determining section that, when reflected light is below a preset threshold, determines that the workpiece is absent on the relevant shelf.

3. The processing apparatus according to claim 1, wherein the control unit includes:
a clamping light amount recording section that records a reflected light amount at a stage at which the workpiece accommodated in the cassette is clamped by the clamping section,
a draw-out light amount recording section that records a reflected light amount at a stage at which the clamping section is spaced away from the cassette in order to draw out the workpiece from the cassette, and
a draw-out determining section that, when a difference between the light amounts recorded in the clamping light amount recording section and the draw-out light amount recording section exceeds a threshold, determines that the workpiece has not been drawn out suitably.

4. The processing apparatus according to claim 1, wherein the control unit includes:
an allowable range recording section that records correlation between a length of insertion of the workpiece into the clamping section in a state in which the support section and the presser section are spaced away from each other and the reflected light amount according to the respective length, and records an allowable range of the reflected light amount corresponding to the length as an allowable range, and
an advance/retraction control section that, when conveying the workpiece into or out of the cassette, advances or retracts the clamping section such that the range of the reflected light amount is within the allowable range.

5. The processing apparatus according to claim 1, wherein the light reflection type sensor includes an optical sensor that irradiates light at the workpiece in the cassette and a light receiver that receives light reflected from the workpiece.

\* \* \* \* \*